(12) United States Patent
Shimizu et al.

(10) Patent No.: US 10,782,621 B2
(45) Date of Patent: Sep. 22, 2020

(54) IMPRINT METHOD, IMPRINT APPARATUS, AND TEMPLATE

(71) Applicant: Toshiba Memory Corporation, Tokyo (JP)

(72) Inventors: Mitsuko Shimizu, Tokyo (JP); Takashi Sato, Kanagawa (JP); Akiko Mimotogi, Kanagawa (JP); Akiko Yamada, Tokyo (JP); Takeshi Suto, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/404,699

(22) Filed: May 6, 2019

(65) Prior Publication Data

US 2019/0302614 A1    Oct. 3, 2019

Related U.S. Application Data (62) Division of application No. 15/255,298, filed on Sep. 2, 2016, now abandoned.

(30) Foreign Application Priority Data

Feb. 16, 2016 (JP) .................................. 2016-026908

(51) Int. Cl.
| | | |
|---|---|---|
| *G03F 7/00* | (2006.01) | |
| *H01L 21/027* | (2006.01) | |
| *G03F 9/00* | (2006.01) | |
| *C09K 11/56* | (2006.01) | |
| *C09K 11/77* | (2006.01) | |

(52) U.S. Cl.
CPC .......... *G03F 9/7042* (2013.01); *C09K 11/565* (2013.01); *C09K 11/7734* (2013.01); *G03F 7/0002* (2013.01); *H01L 21/0271* (2013.01)

(58) Field of Classification Search
CPC ... G03F 9/7042; G03F 7/0002; C09K 11/565; C09K 11/7734
See application file for complete search history.

(56) References Cited

U.S. PATENT DOCUMENTS

| | | |
|---|---|---|
| 7,307,702 B1 | 12/2007 | Mathur et al. |
| 8,006,567 B2 | 8/2011 | Xu et al. |
| 8,475,702 B2 | 7/2013 | Furutono |
| 2006/0228635 A1* | 10/2006 | Suleski ................. B82Y 10/00 430/5 |
| 2009/0140445 A1* | 6/2009 | Lu ......................... G03F 7/0002 264/40.1 |

(Continued)

FOREIGN PATENT DOCUMENTS

| | | |
|---|---|---|
| JP | 2004-85483 A | 3/2004 |
| JP | 2006-284393 A | 10/2006 |

(Continued)

*Primary Examiner* — Nahida Sultana
(74) *Attorney, Agent, or Firm* — Finnegan, Henderson, Farabow, Garrett & Dunner, L.L.P.

(57) ABSTRACT

According to one embodiment, an imprint method is provided. In the imprint method, a template including a mechanoluminescent material is brought into contact with a resist on a substrate. The posture of the template is adjusted on the basis of the intensity of mechanoluminescence from the template. Light is emitted to the resist to harden the resist. The template is separated from the resist.

19 Claims, 9 Drawing Sheets

(56) References Cited

U.S. PATENT DOCUMENTS

| | | | |
|---|---|---|---|
| 2009/0146549 A1* | 6/2009 | Kimura | C09K 11/7734 |
| | | | 313/503 |
| 2011/0018173 A1 | 1/2011 | Furutono | |
| 2011/0109012 A1* | 5/2011 | Furutono | B82Y 10/00 |
| | | | 264/293 |
| 2013/0106023 A1 | 5/2013 | Imura et al. | |
| 2013/0292877 A1* | 11/2013 | Tatsugawa | B82Y 10/00 |
| | | | 264/293 |
| 2014/0151733 A1* | 6/2014 | Koike | G03F 7/0002 |
| | | | 257/98 |
| 2014/0353277 A1* | 12/2014 | Lee | G03F 7/0002 |
| | | | 216/51 |
| 2016/0169453 A1* | 6/2016 | Jeong | F21K 2/04 |
| | | | 362/317 |

FOREIGN PATENT DOCUMENTS

| | | |
|---|---|---|
| JP | 2007-81048 A | 3/2007 |
| JP | 2007-101278 A | 4/2007 |
| JP | 2011-29235 A | 2/2011 |
| JP | 2011-91104 A | 5/2011 |
| JP | 2013-98181 A | 5/2013 |
| WO | WO 2015/190661 A1 | 12/2015 |

* cited by examiner

IMPRINT METHOD, IMPRINT APPARATUS, AND TEMPLATE

CROSS-REFERENCE TO RELATED APPLICATIONS

This application is a division of U.S. patent application Ser. No. 15/255,298, filed Sep. 2, 2016, now abandoned, which is based upon and claims the benefit of priority from Japanese Patent Application No. 2016-026908, filed on Feb. 16, 2016 the entire contents of which are incorporated herein by reference.

FIELD

Embodiments described herein relate generally to an imprint method, an imprint apparatus, and a template.

BACKGROUND

One of the techniques used in a semiconductor device manufacturing process is imprint lithography. The imprint lithography is a technique which imprints a template that is formed by, for example, electron beam (EB) lithography on a resist formed on a substrate to be processed and forms a resist pattern on the substrate to be processed.

In the imprint lithography, in a case in which the template has a large space, such as a void pattern, when the template is pressed against the resist, stress is concentrated on a portion of the template pattern. When stress is concentrated on a portion of the template pattern, in some cases, the template deteriorates or a defect occurs in the formed resist pattern. Therefore, it is preferable accurately measure stress which occurs in the template pattern during imprinting.

DETAILED DESCRIPTION

An embodiment provides an imprint method. In the imprint method, a template including a mechanoluminescent material is brought into contact with a resist on a substrate. The posture of the template is adjusted on the basis of the intensity of mechanoluminescence from the template. Light is emitted to the resist to harden the resist. The template is separated from the resist.

Hereinafter, an imprint method, an imprint apparatus, and a template according to embodiments will be described in detail with reference to the accompanying drawings. The invention is not limited by these embodiments.

First Embodiment

Figure 1:
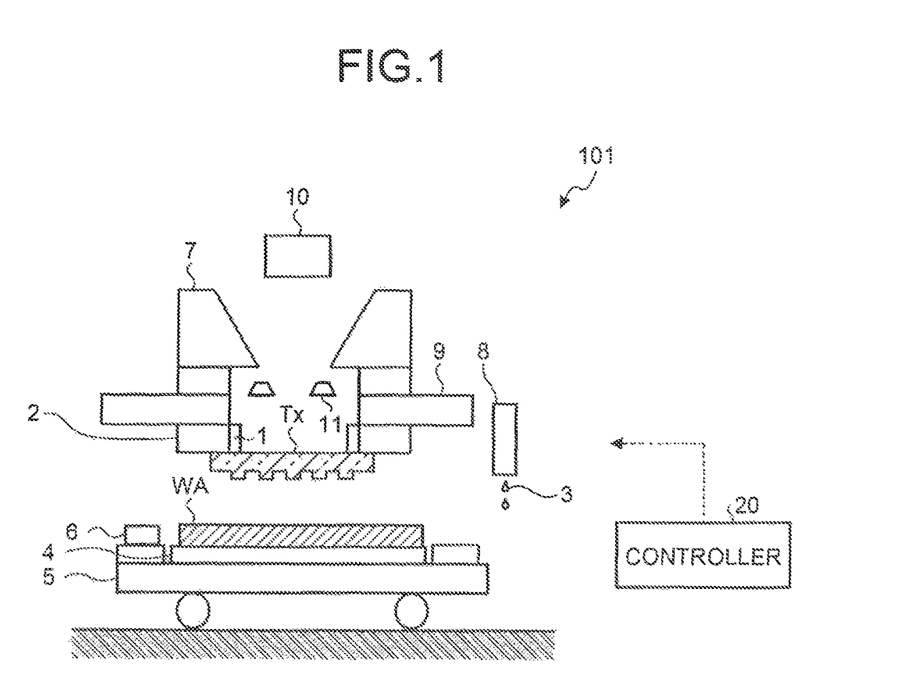
FIG. 1 is a diagram illustrating the structure of an imprint apparatus according to a first embodiment.

FIG. 1 is a diagram illustrating the structure of an imprint apparatus according to a first embodiment. An imprint apparatus 101 is a semiconductor manufacturing apparatus that transfers the pattern of a template Tx, which is a mold substrate, to a substrate to which a pattern is to be transferred, such as a wafer WA. The template Tx is an original plate used in imprint lithography.

The template Tx according to this embodiment has a template pattern and includes a mechanoluminescent material. The mechanoluminescent material is a material that directly converts weak mechanical energy which is applied to the template Tx serving as a subject into light. Therefore, when stress is applied to the mechanoluminescent material, the mechanoluminescent material emits light with intensity that is proportional to the magnitude (load intensity) of the stress. The mechanoluminescent material emits light only when pressure is applied to the mechanoluminescent material. When the pressure is cancelled, the mechanoluminescent material returns to the original state.

The imprint apparatus 101 measures the mechanoluminescence intensity from the template Tx when the template Tx is imprinted on a resist 3 and controls the posture of the template Tx on the basis of the measurement result.

The template Tx is made of a member that transmits light. The material that transmits light may be quartz glass or a transparent resin. A template pattern is three-dimensionally formed in a surface (lower surface) of the template Tx. A template pattern surface of the template Tx has high flatness and adhesion between the template pattern surface of the template Tx and the surface of the wafer WA (resist 3) is maintained.

The imprint apparatus 101 includes a posture control mechanism 1, an original plate stage 2, a substrate chuck 4, a sample stage 5, a reference mark 6, an alignment sensor 7, a liquid dropping device 6, a stage base 9, a light source 10, and a light receiver 11. In addition, the imprint apparatus 101 according to this embodiment includes a controller 20.

The wafer WA, which is a substrate to be processed, is placed on the sample stage 5. The sample stage 5 moves the wafer WA placed thereon in a parallel plane (horizontal plane). The sample stage 5 moves the wafer WA below the liquid dropping device 8 when the resist 3 serving as a transfer material is dropped to the wafer WA and moves the wafer WA below the template Tx when a transfer process is performed for the wafer WA.

The substrate chuck 4 is provided on the sample stage 5. The substrate chuck 4 fixes the wafer WA at a certain position on the sample stage 5. In addition, the reference mark 6 is provided on the sample stage 5. The reference mark 6 is a mark for detecting the position of the sample stage 5 and is used for alignment when the wafer WA is leaded on the sample stage 5.

The original plate stage 2 is provided on the lower surface (a surface facing the wafer WA) of the stage base 9. The original plate stage 2 fixes the template Tx at a certain position from the rear surface (a surface in which no template pattern is formed) of the template Tx, using, for example, vacuum suction.

The stage base 9 supports the template Tx, using the original plate stage 2, and presses the pattern (for example, a circuit pattern) of the template Tx against the resist 3 on the wafer WA. The stage base 9 is moved in the up-down direction (vertical direction) to press the template Tx against the resist 3 and to separate (detach) the template Tx from the resist 3. The resist 3 which is used for imprinting is, for example, a photo-curable resin (a photo-curing agent). The alignment sensor 7 is provided on the stage base 9. The alignment sensor 7 detects the position of the wafer WA or the position of the template Tx.

The liquid dropping device 8 drops the resist 3 onto the wafer WA using an inkjet method. An inkjet head (not illustrated) provided in the liquid dropping device 7 has a plurality of microholes for discharging liquid droplets of the resist 3.

The light source 10 is a device that emits light and is provided above the stage base 9. The light source 10 emits light to the template Tx, with the template Tx pressed against the resist 3. The light emitted from the light source 10 may be any one of visible light, infrared rays, and ultraviolet rays as long as it can harden the resist 3.

The light receiver 11 is provided above the stage base 9. The light receiver 11 is a device that measures the intensity of mechanoluminescence (mechanoluminescence intensity). When the template Tx is pressed against the resist 3, the light receiver 11 measures the intensity of mechanoluminescence from the template Tx. The light receiver 11 measures mechanoluminescence intensity from the rear surface (a surface opposite to the surface in which the template pattern is formed) of the template Tx. The light receiver 11 transmits the measured mechanoluminescence intensity to the controller 20.

The posture control mechanism 1 includes an element that can be expanded and contracted in a direction perpendicular to the template pattern surface. The posture control mechanism 1 is provided in each certain block (region) of the template Tx on the rear surface of the template Tx. In other words, the posture control mechanism 1 is arranged on the rear surface of the template Tx at certain intervals. When the template Tx is pressed against the resist 3, the posture control mechanism 1 presses each position of the rear surface of the template Tx with force corresponding to each position of the rear surface of the template Tx. The posture control mechanism 1 presses the template Tx from the rear surface side of the template Tx to adjust, for example, the inclination of the template Tx before the template Tx is irradiated with light. The posture control mechanism 1 is separated from the template Tx when the template Tx is detached.

The controller 20 is connected to each component of the imprint apparatus 101 and controls each component, which is not illustrated. When the template Tx is pressed against the resist 3, the controller 20 determines a position where stress (load) is concentrated in the template pattern, on the basis of the measurement result (mechanoluminescence intensity) transmitted from the light receiver 11. The controller 20 controls the posture control mechanism 1 such that the template Tx has a desired posture (stress is reduced), on the basis of the determination result of stress. The posture control mechanism 1 adjusts the posture of the template Tx such that, for example, the distortion, inclination, curving, and deformation of the template pattern are reduced (averaged).

When imprinting is performed on the wafer WA, the wafer WA placed on the sample stage 5 is moved below the liquid dropping device 8. Then, the resist 3 is dropped to a certain shot position of the wafer WA.

Then, the wafer WA on the sample stage 5 is moved immediately below the template Tx. Then, the template Tx is pressed against the resist 3 on the wafer WA. In other words, the template Tx and the resist 3 come into contact with each other. The template Tx and the resist 3 come into contact with each other for a certain period of time.

With the template pattern filled with the resist 3, the light source 10 emits light to the resist 3 to harden the resist 3. Then, a transfer pattern corresponding to the template pattern is formed in the resist 3 on the wafer WA. Then, the imprint process is performed at the next shot position. When the imprint process at all of the shot positions or the wafer WA is completed, the wafer WA is carried out.

Next, the procedure of the imprint process will be described. Here, a process of pressing the template Tx against the resist 3 in the Imprint process will be described. FIGS. 2A to 2E are diagrams illustrating the processing process in the imprint process. FIGS. 2A to 2E are cross-sectional views illustrating, for example, the wafer WA and a template T1 which is an example of the template Tx in the imprint process.

Figure 2A:
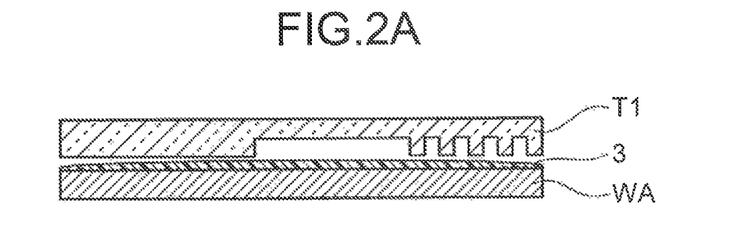
FIGS. 2A to 2E are diagrams illustrating a pressing process in an imprint process.
Figure 2B:
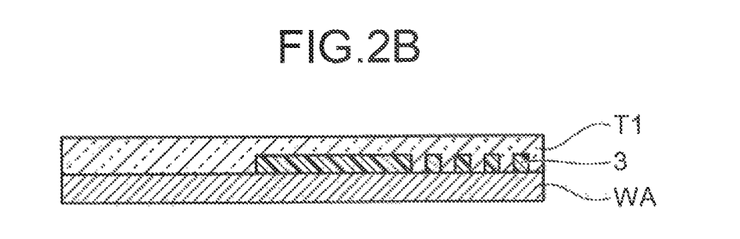

The resist 3 is dropped to the upper surface of the wafer WA. The resist 3 is applied onto the upper surface of the wafer WA. Each liquid droplet of the resist 3 dropped to the wafer WA is spread in the surface of the wafer WA. Then, as illustrated in FIG. 2A, the template T1 is moved to the resist 3. As illustrated in FIG. 2B, the template T1 is pressed against the resist 3. Then, the resist 3 flows in a template pattern shape. As such, when the template T1 having a template pattern, which is an uneven pattern, formed therein comes into contact with the resist 3, the resist 3 flows into the template pattern by a capillary phenomenon.

Figure 2C:
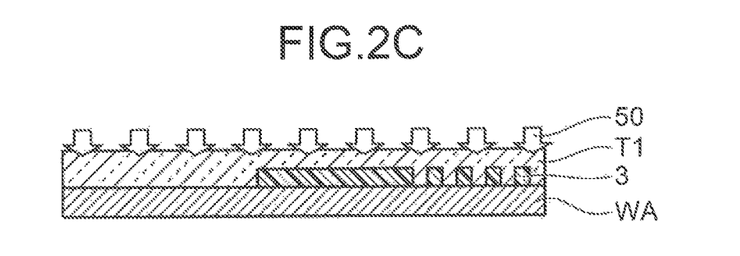
Figure 2D:
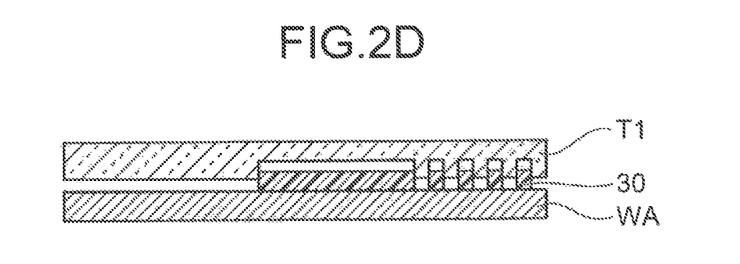
Figure 2E:
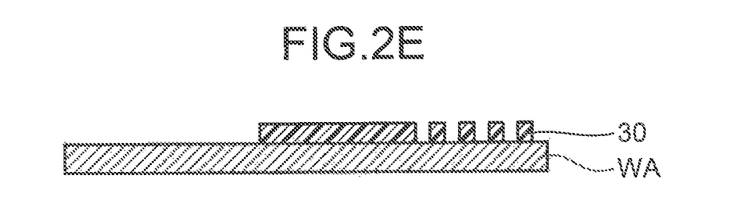

The template T1 is filled with the resist 3 for a predetermined period of time. Then, as illustrated in FIG. 2C, the rear surface of the template T1 is irradiated with light 50. Then, the light 50 is emitted to the resist 3 through the template T1 and the resist 3 is hardened. Then, as illustrated in FIG. 2D, the template T1 is separated from a resist pattern 30 formed by the hardening of the resist 3. In this way, as illustrated in FIG. 2E, the resist pattern 30 corresponding to the template pattern is formed on the wafer WA. As such, the imprint process is performed to form the resist pattern 30 in a three-dimensional shape on the wafer WA.

Figure 3:
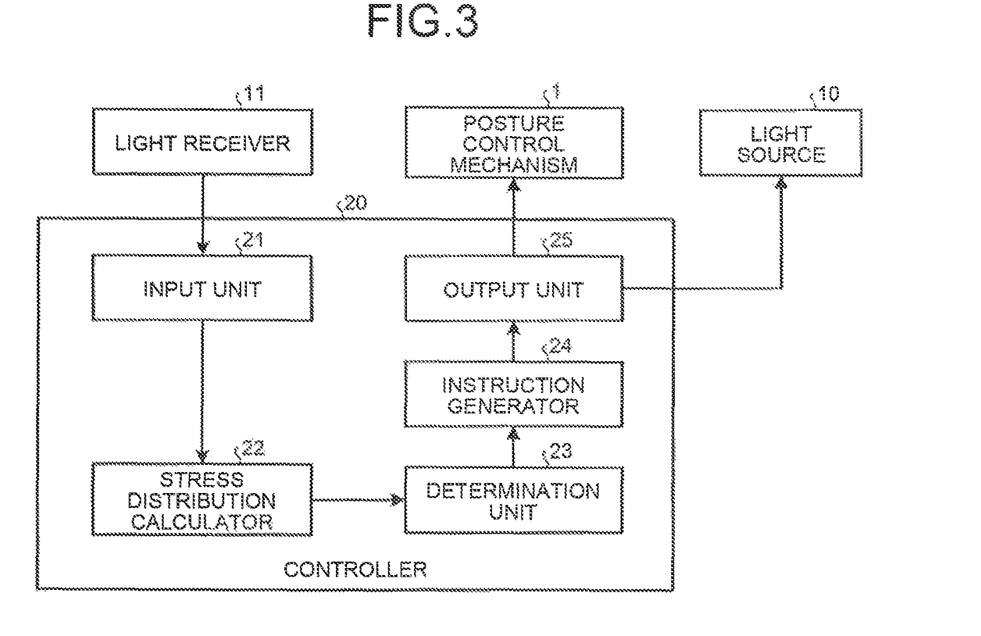
FIG. 3 is a diagram illustrating the structure of a controller according to the first embodiment.

FIG. 3 is a block diagram illustrating the structure of the controller according to the first embodiment. The controller 20 is connected to the light receiver 11, the posture control mechanism 1, and the light source 10. The controller 20 includes an input unit 21, a stress distribution calculator (stress distribution calculation module) 22, a determination unit (determination module) 3, an instruction generator (instruction generation module) 24, and an output unit 25.

Mechanoluminescence intensity is input from the light receiver 11 to the input unit 21. The input unit 21 transmits the mechanoluminescence intensity to the stress distribution calculator 22. The stress distribution calculator 22 calculates a light emission position of the template Tx on the basis of a pattern layout (design data) and a position where the emitted light is detected. The stress distribution calculator 22 calculates a stress distribution of the template Tx on the basis of the light emission position of the template Tx and the mechanoluminescence intensity. In this embodiment, the stress distribution calculator 22 calculates a mechanoluminescence intensity distribution corresponding to the stress distribution, in place of the stress distribution of the template Tx. In this embodiment, the light receiver 11 measures mechanoluminescence intensity during imprinting and the stress distribution calculator 22 calculates a stress distribution (mechanoluminescence intensity distribution) during imprinting. The stress distribution is a map indicating the level of the mechanoluminescence intensity at each position or the template pattern. The stress distribution calculator 22 transmits the mechanoluminescence intensity distribution as the stress distribution to the determination unit 23.

The determination unit 23 determines whether the mechanoluminescence intensity at each position of the template pattern is within a first threshold value. In other words, the determination unit 23 determines whether the mechanoluminescence intensity distribution corresponding to the stress distribution is within the first threshold value. The determination unit 23 generates first determination result information in which each position of the template pattern is associated with the determination result (of whether the mechanoluminescence intensity distribution is equal to or greater than the first threshold value) and transmits the first determination result information to the instruction generator 24.

The instruction generator 24 generates an instruction based on the first determination result information. Specifically, when the mechanoluminescence intensity at any pattern position is equal to or greater than a first threshold value in the first determination result information, the instruction generator 24 generates an instruction (hereinafter, referred to as a posture adjustment instruction) to adjust the posture (stress distribution) of the template Tx. When the mechanoluminescence intensities at all of the pattern positions are less than the first threshold value in the first determination result information, the instruction generator 24 generates an instruction (hereinafter, referred to as a light emission instruction) to direct the light source 10 to emit light. The instruction generator 24 transmits the posture adjustment instruction or the light emission instruction to the output unit 25. When the mechanoluminescence intensity is equal to the first threshold value, the instruction generator 24 may generate the light emission instruction, in place of the posture adjustment instruction. The output unit 25 transmits the posture adjustment instruction to the posture control mechanism 1. In addition, the output unit 25 transmits the light emission instruction to the light source 10.

The determination unit 23 may generate first determination result information indicating how much greater the mechanoluminescence intensity at each position of the template pattern is than the first threshold value. In this case, the instruction generator 24 generates the posture adjustment instruction on the basis of how much greater the mechanoluminescence intensity at each position of the template pattern is than the first threshold value. The posture adjustment instruction corresponds to the stress distribution and is issued to average the stress distribution (reduce the concentration of stress).

Figure 4:
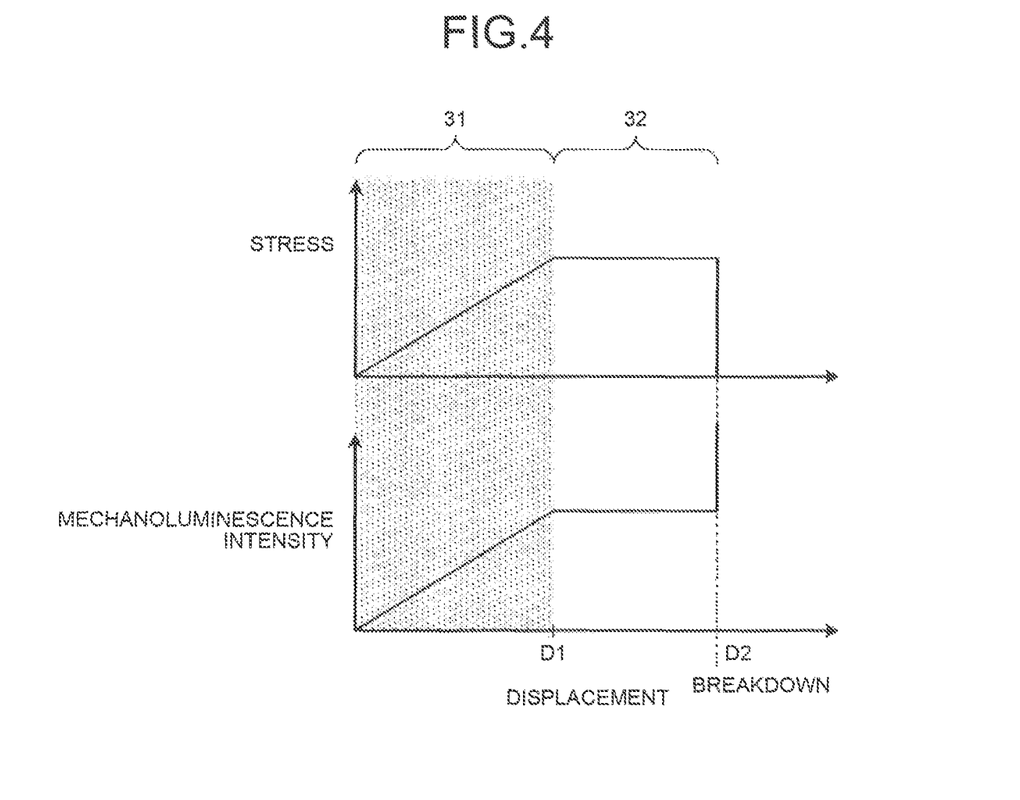
FIG. 4 is a diagram illustrating the characteristics of a template according to the first embodiment.

Next, the characteristics of the template Tx including the mechanoluminescent material will be described. FIG. 4 is a diagram illustrating the characteristics of the template according to the first embodiment. In a graph illustrated in FIG. 4, the horizontal axis is the displacement of the template Tx. In addition, the upper side of the vertical axis indicates stress applied to the template Tx and the lower side indicates mechanoluminescence intensity. Therefore, an upper graph of FIG. 4 illustrates the relationship between the displacement of the template Tx and stress applied to the template Tx. A lower graph of FIG. 4 illustrates the relationship between the displacement of the template Tx and the mechanoluminescence intensity from the template Tx.

The mechanoluminescence is a phenomenon in which, when mechanical force is applied, light is generated. The mechanoluminescent material is a material which emits light when stress is changed. The mechanoluminescent material is a mechanoluminescent inorganic material which is fine particle powder and in which an element that is a light emission center is added to an inorganic crystal skeleton with a specially processed structure.

An example of the mechanoluminescent material is an oxide including fine ceramic particles, such as a mixture of zinc sulfide (ZnS) and manganese (Mn). In addition, the mechanoluminescent material may be a mixture of strontium aluminate ($SrAl_2O_4$) and europium (Eu). In this embodiment, the template Tx is mixed with the mechanoluminescent material. Therefore, when stress is applied to the template Tx, the mechanoluminescent material emits light with intensity corresponding to the stress. Therefore, light is emitted from a portion of the template Tx on which load is likely to be concentration when the template Tx is pressed against the resist 3.

The template Tx is elastically deformed in a displacement range 31 from 0 to D1 and is plastically deformed in a displacement range 32 from D1 to D2. As such the displacement=D1 is the boundary between elastic deformation and plastic deformation.

When the template Tx is elastically deformed, displacement is proportional to the intensity of stress. When the displacement of the template Tx is greater than D1, the stress of the template Tx is constant. The template Tx is broken when the displacement of the template Tx reaches D2.

The mechanoluminescent material is elastically deformed in the displacement range 31 from 0 to D1. The mechanoluminescent material is plastically deformed in the displacement range 32 that is equal to or greater than D1 and emits light. As such, the displacement D1 is the boundary between light emission caused by elastic deformation and light emission caused by plastic deformation.

When the mechanoluminescent material is elastically deformed and emits light, displacement is proportional to mechanoluminescence intensity. As such, when the mechanoluminescent material is elastically deformed, mechanoluminescence intensity is changed in proportion to displacement (stress). When the displacement of the template Tx is greater than D1, the mechanoluminescence intensity of the mechanoluminescent material is constant. When the displacement of the template Tx is equal to D2, the mechanoluminescent material is broken and emits light.

Figure 5A:
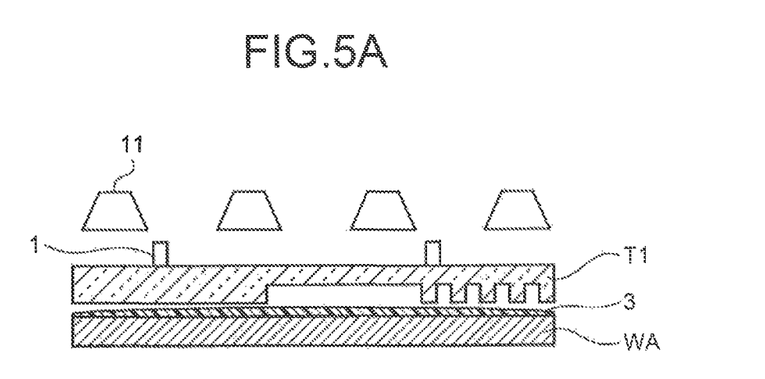
FIGS. 5A to 5C are diagrams illustrating posture adjustment according to mechanoluminescence intensity.
Figure 5B:
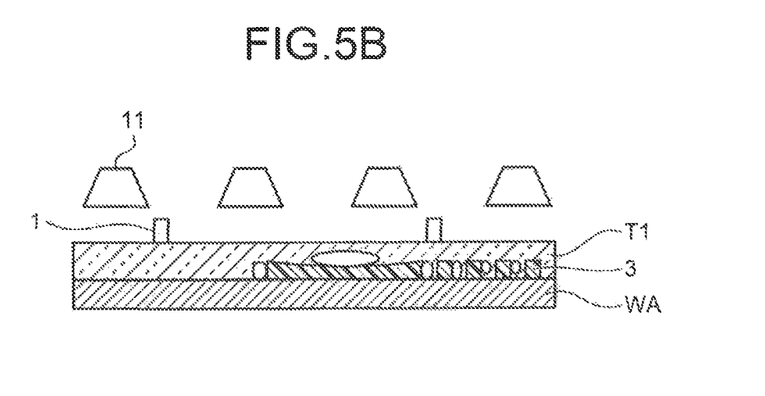
Figure 5C:
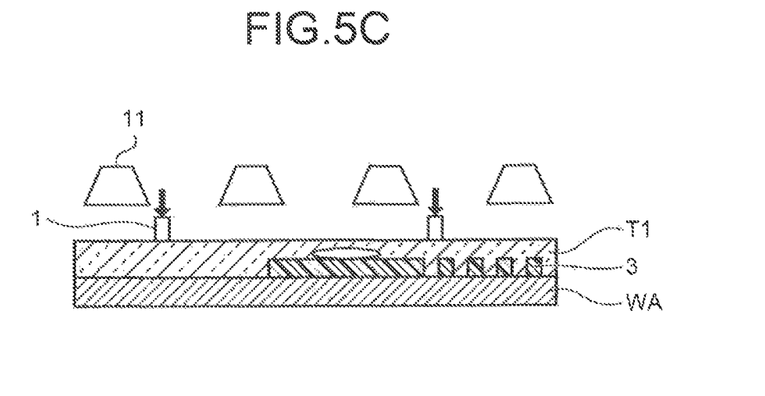

FIGS. 5A to 5C are diagrams illustrating a process of adjusting the posture of the template according to mechanoluminescence intensity. FIGS. 5A to 5C are cross-sectional views illustrating, for example, the wafer WA, the template T1, the light receiver 11, and the posture control mechanism 1.

As illustrated in FIG. 5A, when the imprint process starts, the template T1 and the resist 3 approach each other. Then, at the time when the template T1 starts to come into contact with the resist 3, a large change in stress occurs in the template T1 as illustrated in FIG. 5B. Then, the mechanoluminescent material included in the template T1 emits light. In this embodiment, the light receiver 11 measures mechanoluminescence intensity from the mechanoluminescent material. Then, the posture control mechanism 1 adjusts the posture of the template T1 by an amount corresponding to the mechanoluminescence intensity, as illustrated in FIG. 5C. In this case, the posture control mechanism 1 adjusts the posture of the template T1 such that the mechanoluminescence intensity from the mechanoluminescent material is averaged.

Figure 6:
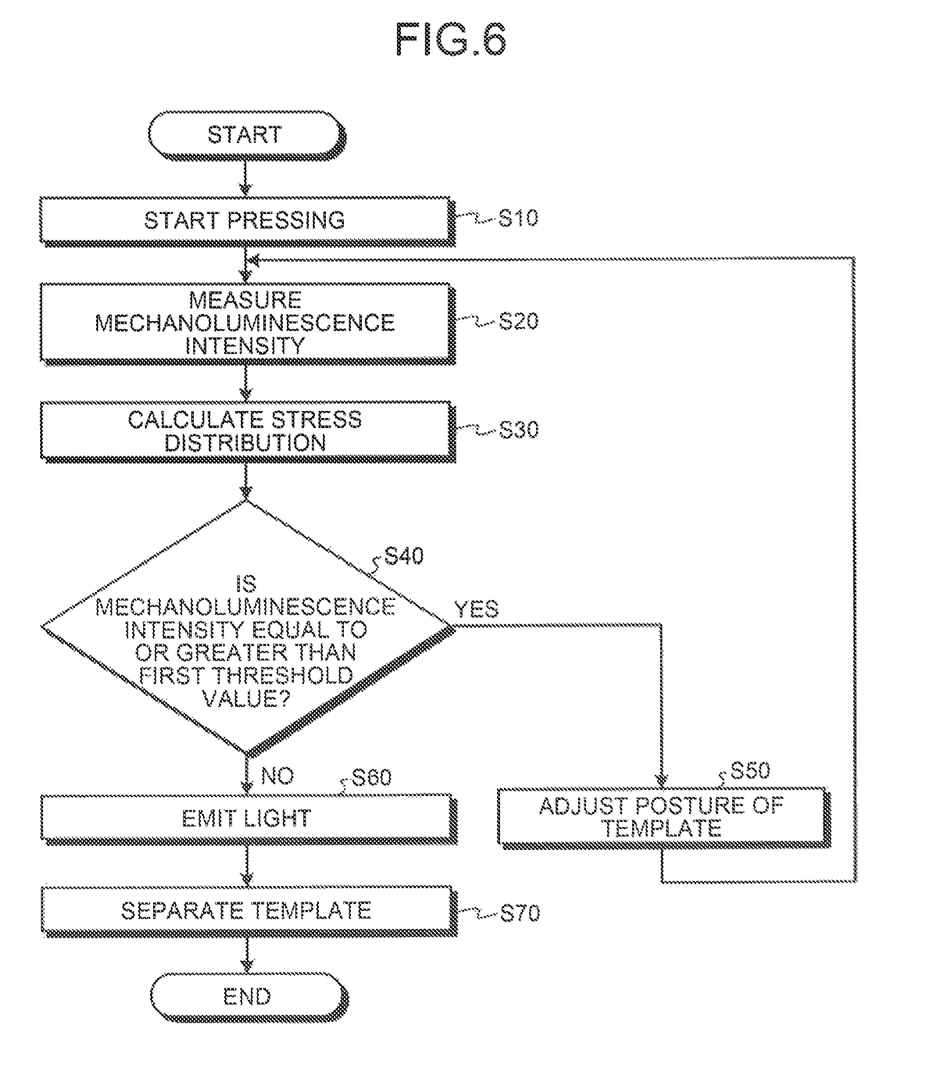
FIG. 6 is a flowchart illustrating the procedure of a posture adjustment process according the first embodiment.

FIG. 6 is a flowchart illustrating the procedure of the posture adjustment process according to the first embodiment. When the imprint apparatus 101 starts to press the template T1 against the resist 3 (Step S10), the light receiver 11 measures mechanoluminescence intensity (Step S20). The light receiver 11 associates the measured mechanoluminescence intensity with a light emission position and transmits the mechanoluminescence intensity and the light emission position to the controller 20.

The mechanoluminescence intensity and the light emission position from the light receiver 11 are input to the input unit 21 and are transmitted to the stress distribution calculator 22. The stress distribution calculator 22 calculates the stress distribution (mechanoluminescence intensity distribution) of the template T1 on the basis of the pattern layout, the light emission position, and the mechanoluminescence intensity (Step S30).

The determination unit 23 determines whether the mechanoluminescence intensity at each position of the template pattern is equal to or greater than the first threshold value (Step S40). The determination unit 23 generates the first determination result information on the basis of the determination result and transmits the first determination result information to the instruction generator 24.

The instruction generator 24 generates an instruction corresponding to the first determination result information. When the first determination result information indicates that the first threshold value is equal to or less than the mechanoluminescence intensity, the instruction generator 24 generates the posture adjustment instruction. The posture adjustment instruction is transmitted to the posture control mechanism 1. Then, the posture control mechanism 1 adjusts the posture of the template T1 on the basis of the posture adjustment instruction. In other words, when the mechanoluminescence intensity is equal to or greater than the first threshold value (Step S40, Yes), the posture control mechanism 1 adjusts the posture of the template T1 for each certain block (Step S50). As such, the imprint apparatus 101 adjusts the inclination of the template T1 when the template T1 is pressed against the resist 3, on the basis of the stress distribution.

Then, the imprint apparatus 101 performs the process from Step S20 to Step S40 again. That is, the imprint apparatus 101 measures mechanoluminescence after the posture is adjusted (Step S20) and calculates the stress distribution on the basis of the mechanoluminescence distribution (Step S30). Then, the imprint apparatus 101 determines whether the mechanoluminescence intensity is equal to or greater than the first threshold value (Step S40). When the mechanoluminescence intensity is equal to or greater than the first threshold value (Step S40, Yes), the posture control mechanism 1 adjusts the posture of the template T1 (Step S50). The imprint apparatus 101 repeats the process from Step S20 to Step S50 until the mechanoluminescence intensity is uniformized below the first threshold value.

When the first determination result information indicates that the first threshold value is greater than the mechanoluminescence intensity in Step S40, the instruction generator 24 generates the light emission instruction. The light emission instruction is transmitted to the light source 10. Then, the light source 10 emits light to the resist 3 from the upper side of the template T1. In other words, when the mechanoluminescence intensity is less than the first threshold value (Step S40, No), the light source 10 emits light to the resist 3 from the upper side of the template T1 (Step S60). Then, the resist 3 is hardened and the resist pattern 30 is obtained. Then, the imprint apparatus 101 performs a demolding (releasing) process of separating the template T1 from the resist pattern 30 (Step S70).

As such, the imprint apparatus 101 performs imprinting, using the template T1 including the mechanoluminescent material. Then, the stress distribution caused by, for example, the shape of the template pattern is detected on the basis of mechanoluminescence when the template T1 is pressed against the resist 3. In addition, when the template T1 is pressed against the resist 3, the posture of the template T1 is controlled on the basis of the stress distribution. Therefore, it is possible to reduce load applied to the template T1.

A substrate (plate member) before a template pattern is formed may include the mechanoluminescent material. The template pattern is formed in the substrate to form the template T1 including the mechanoluminescent material.

As such, in the first embodiment, the template T1 includes the mechanoluminescent material. According to this structure, it is possible to accurately measure stress which occurs in the template pattern when the template T1 is pressed against the resist 3. Therefore, it is possible to appropriately adjust the posture of the template T1 such that stress applied to the template T1 is reduced. As a result, it is possible to prevent the positional deviation of the resist pattern 30. In addition, it is possible to reduce load applied to the template T1 and thus to increase the lifespan of the template T1.

Second Embodiment

Next, a second embodiment will be described with reference to FIG. 7. In the second embodiment, the replacement time of a template T1 is determined (abnormality is determined) on the basis of a stress distribution of the template T1 when the template T1 is pressed against the resist 3.

The template T1 for imprinting is repeatedly used. Therefore, the mechanoluminescence intensity of the template T1 varies depending on the deterioration of its own template T1 whenever the template T1 is used, which results in a large variation in the stress distribution.

For this reason, in this embodiment, the replacement time of the template T1 is determined (abnormality is determined) on the basis of the difference between the mechanoluminescence intensity after posture adjustment, which is measured when the template T1 is pressed against the resist 3 before light is emitted, and the mechanoluminescence intensity after posture adjustment which is measured first whenever the posture of the template T1 is controlled by the same method as that in the first embodiment.

Figure 7:
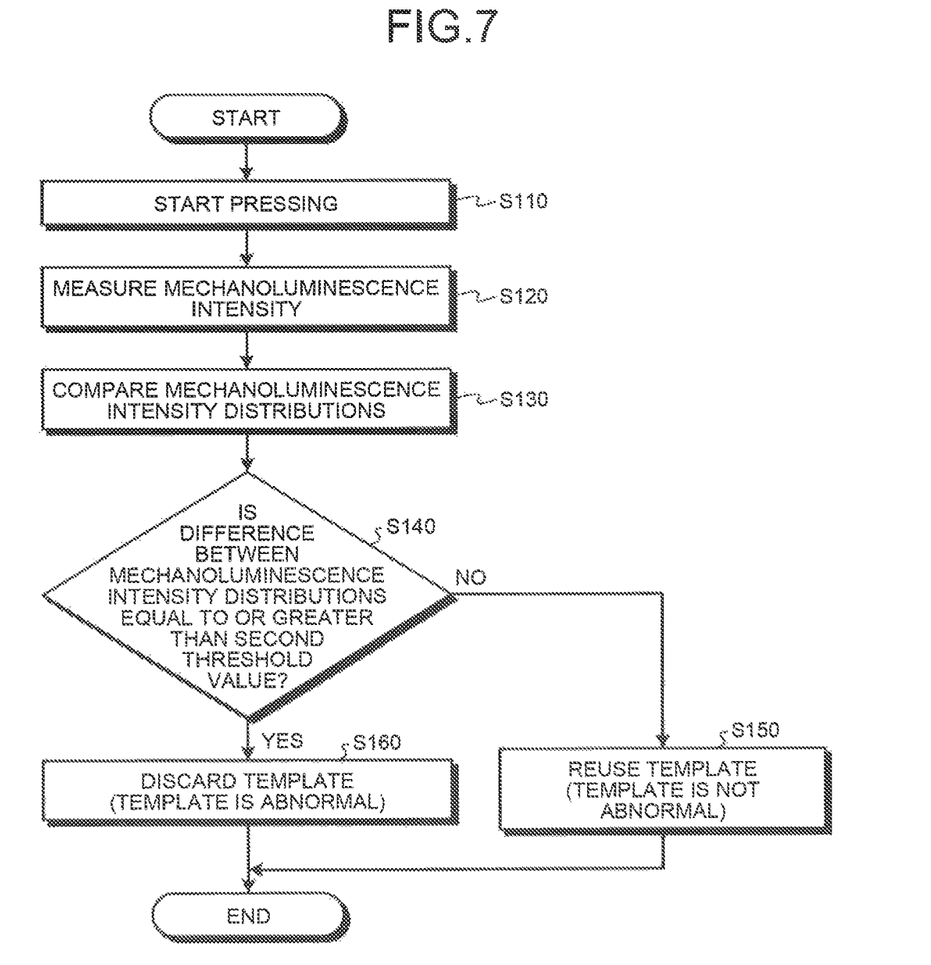
FIG. 7 is a flowchart illustrating the procedure of a template replacement process (abnormality determination) according to a second embodiment.

FIG. 7 is a flowchart illustrating the procedure of a template replacement process (abnormality determination) according to the second embodiment. When an imprint apparatus 101 starts to press the template T1 against the resist 3 (Step S110), a light receiver 11 measures mechanoluminescence intensity (Step S120). In this embodiment, the light receiver 11 measures mechanoluminescence intensity, with a posture control mechanism 1 adjusted the posture of the template T1. Here, the imprint apparatus 101 adjusts the posture of the template T1, using the same process as that in the first embodiment. The light receiver 11 associates the measured mechanoluminescence intensity with a light emission position and transmits the mechanoluminescence intensity and the light emission position to a controller 20.

The mechanoluminescence intensity and the light emission position from the light receiver 11 are input to an input unit 21 and are then transmitted to a stress distribution calculator 22. The stress distribution calculator 22 calculates a stress distribution (mechanoluminescence intensity distribution) of the template T1 on the basis of a pattern layout, the light emission position, and the mechanoluminescence intensity.

The determination unit 23 compares the calculated mechanoluminescence intensity distribution (current distribution) with the mechanoluminescence intensity distribution (first distribution) of the template pattern which has been measured first (Step S130). Here, the first distribution is a mechanoluminescence intensity distribution when the template T1 is used first. In addition, the current distribution is the N-th mechanoluminescence intensity distribution of the template T1 (N is a natural number equal to or greater than 2). The current distribution or the first distribution may be the difference between the maximum value and the minimum value of the mechanoluminescence intensity or a value such as a standard deviation. The determination unit 23 calculates the difference between the current distribution and the first distribution.

The determination unit 23 determines whether the difference between the mechanoluminescence intensity distributions of the template pattern is equal to or greater than a second threshold value (Step S140). When the characteristics of the template T1 are, for example, the characteristics illustrated in the graph of FIG. 4, the second threshold value is set on the basis of the graph (the characteristics of the template T1) illustrated in FIG. 4. That is, the second threshold value is set to a value at which the template T1 is not broken by plastic deformation.

Here, a range in which the second threshold value can be set will be described. The range in which the second threshold value can be set is a range in which the template T1 can be elastically deformed. Therefore, the second threshold value is set on the basis of the mechanoluminescence intensity (hereinafter, referred to as emission intensity Ex) at which the plastic deformation of the template T1 starts. The template T1 may be managed at a value (management value) that is less than the light emission intensity Ex or is equal to or less than the light emission intensity Ex in order to prevent the template T1 from being broken by plastic deformation. Therefore, the second threshold value may be set, using a value (mechanoluminescence intensity) during elastic deformation before the template T1 is broken. In other words, the second threshold value may be set on the basis of the management value of the template T1.

Since the deformation characteristics (the relationship between displacement and stress) of the template T1 vary depending on, for example, the thickness of the template T1, the management value of the template T1 is set for each template T1. Therefore, the second threshold value is set for each template T1. The second threshold value is set on the basis of the deformation characteristics or the emission characteristics (the relationship between displacement and mechanoluminescence intensity) of the template T1 which have been measured in advance by, for example, an experiment. As such, in this embodiment, the second threshold value is set on the basis of, for example, the structure (intensity) of the template pattern.

When the second threshold value is greater than (the difference between the distributions) (Step S140, No), the determination unit 23 determines that the template T1 is reused (Step S150). As such, when the difference between the mechanoluminescence intensity distributions is less than the second threshold value, it is determined that the template T1 does not need to be replaced (is not abnormal) since the deterioration of the template T1 is not in progress.

The determination unit 23 generates second determination result information indicating that the template T1 is determined to be reused (is not abnormal) and transmits the second determination result information to the instruction generator 24. The instruction generator 24 generates a display instruction to display the second determination result information and transmits the display instruction to, for example, a display device (not illustrated).

It is determined in step S140 that the second threshold value is equal to or less than (the difference between the distributions) (Step S140, Yes), the determination unit 22 determines that a process of discarding the template T1 is performed (the template T1 is abnormal) (Step S160). As such, when the difference between the distributions is equal to or greater than the second threshold value, it is determined that the template T1 needs to be replaced (is abnormal) since the deterioration of the template T1 is in progress. When the difference between the distributions is equal to the second threshold value, the determination unit 22 may determine that the template T1 is reused (is not abnormal).

When it is determined that the template T1 is reused (is not abnormal) or when it is determined that the template T1 is discarded (is abnormal), the imprint apparatus 101 controls the posture of the template T1 according to stress and emits light to the resist 3, similarly to the first embodiment. Then, the resist 3 is hardened and the resist pattern 30 is formed. Then, the imprint apparatus 101 performs a demolding process of separating the template T1 from the resist pattern 30.

As such, in this embodiment, it is possible to determine the lifespan (abnormality) of the template T1 before a defect occurs in the template pattern. Therefore, the imprint process is not performed using a defective template pattern. In contrast, in a method which replaces the template T1 after a defect occurs in the template pattern, the imprint process is performed using the defective template pattern.

The determination unit 23 may determine the lifespan (abnormality) of the template T1, on the basis of the current stress distribution, without using the first stress distribution. The determination unit 23 may determine the lifespan (abnormality) of the template T1, on the basis of the history of a change in the stress distribution.

As such, in the second embodiment, the lifespan (abnormality) of the template T1 is determined on the basis of the stress distribution of the template T1. Therefore, it is possible to accurately determine the lifespan (abnormality) of the template T1. In addition, even if the template T1 is repeatedly used, it is possible to determine the lifespan (abnormality) of the template T1 before a defect occurs in the template pattern.

Third Embodiment

Next, a third embodiment will be described with reference to FIGS. 8 to 10. In the third embodiment, a test pattern (second pattern) for determining a lifespan (abnormality) is formed in a template and the replacement time (abnormality) of the template is determined on the basis of the mechanoluminescence intensity of the test pattern.

Figure 8:
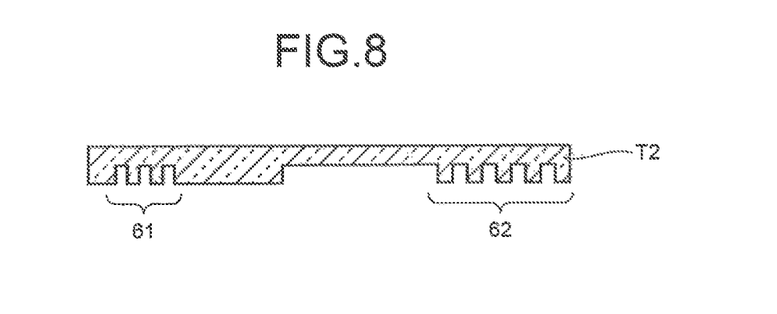
FIG. 8 is a diagram illustrating the structure of a template according to a third embodiment.

FIG. 8 is a diagram illustrating the structure of a template according to the third embodiment. FIG. 8 illustrates the cross-sectional structure of a template T2 which is an example of a template Tx. The template T2 is formed using the same member as that used to form the template T1. Therefore, the template T2 includes a mechanoluminescent material and transmits light. In this embodiment, the template T2 includes a template pattern 62 (first pattern) and a test pattern 61 (second pattern).

The test pattern (pattern for determination) 61 deteriorates more rapidly than the template pattern 62 and has a lower strength than the template pattern 62 (canary pattern). Therefore, the test pattern 61 is deformed before the template pattern 62 is deformed. For example, the test pattern 61 is a smaller pattern width (protrusion portion) and a larger pattern depth than the template pattern 62.

Figure 9A:
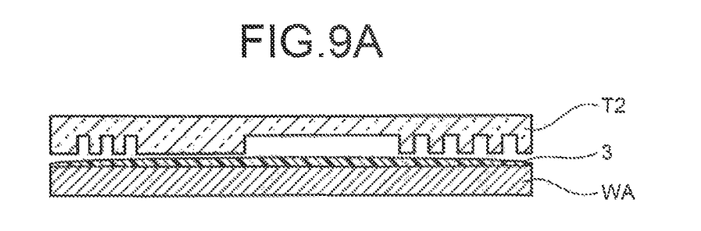
FIGS. 9A and 9B are diagrams illustrating an imprint process according to the third embodiment.
Figure 9B:
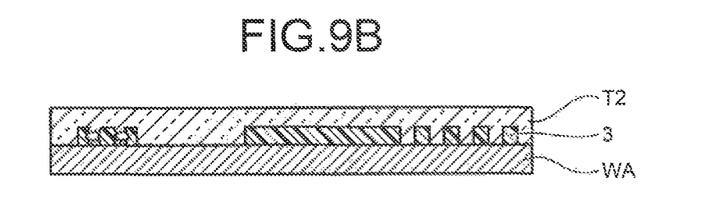

FIGS. 9A and 9B are diagrams illustrating an imprint process according to the third embodiment. FIGS. 9A and 9B are cross-sectional views illustrating, for example, a wafer WA, a template T2, and a resist 3. As illustrated in FIG. 9A, when the imprint process starts, the template T2 and the resist 3 approach each other. Then, after the template T2 and the resist 3 start to come into contact with each other, a large change in stress occurs in the template T2 as illustrated in FIG. 9B. In this case, since the test pattern 61 has lower strength than the template pattern 62, stress applied to the test pattern 61 is higher than that applied to the template pattern 62. Therefore, the force required the test pattern 61 to emit light is lower than that required for the template pattern 62 to emit light. In this embodiment, the replacement time (abnormality) of the template T2 is determined on the basis of the mechanoluminescence intensity of the test pattern 61.

Figure 10:
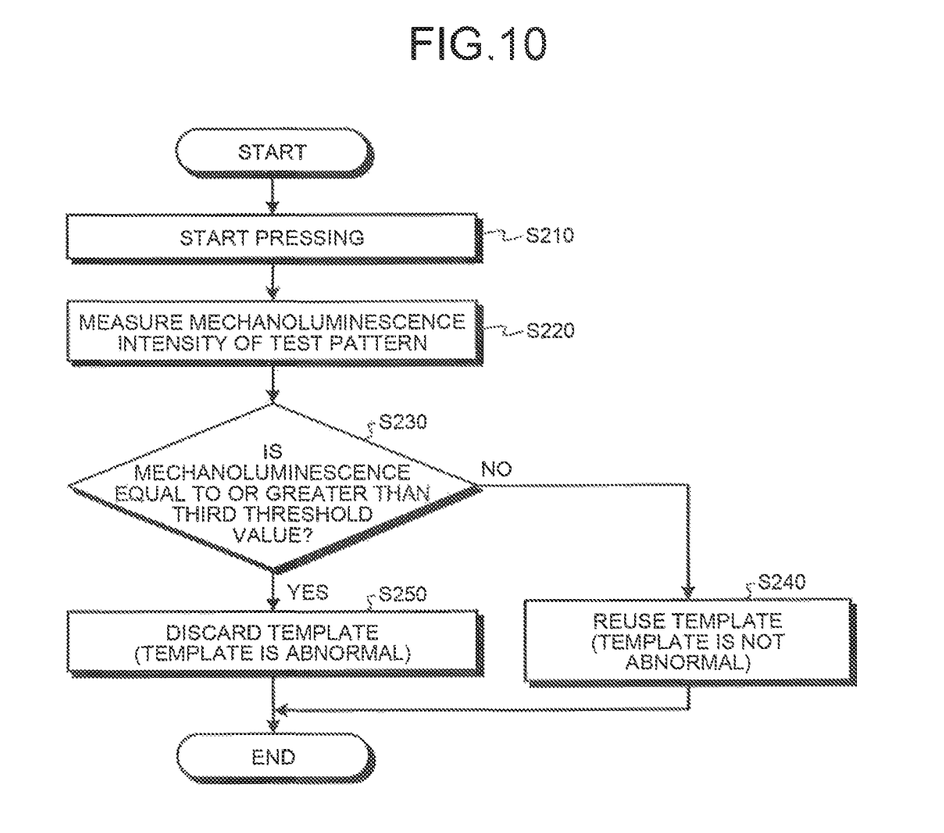
FIG. 10 is a diagram illustrating the procedure of a template replacement process (abnormality determination) according to the third embodiment.

FIG. 10 is a flowchart illustrating the procedure of a template replacement process (abnormality determination) according to the third embodiment. When an imprint apparatus 101 starts to press the template T2 against the resist 3 (step S210), a light receiver 11 measures mechanoluminescence intensity. In this embodiment, the light receiver 11 measures mechanoluminescence intensity from the test pattern 61 (Step S220). The light receiver 11 associates the measured mechanoluminescence intensity with a light emission position and transmits the mechanoluminescence intensity to a controller 20.

The mechanoluminescence intensity from the light receiver 11 is transmitted from an input unit 21 to a determination unit 23. The determination unit 23 determines whether the mechanoluminescence intensity of the test pattern 61 is equal to or greater than a third threshold value (Step S230). When the characteristics of the test pattern 61 are, for example, the characteristics illustrated in the graph of FIG. 4, the third threshold value is set on the basis of the graph (the characteristics of the test pattern 61) illustrated in FIG. 4. That is, the third threshold value is set to a value at which the test pattern 61 is not broken by plastic deformation.

Here, a range in which the third threshold value can be set will be described. The range in which the third threshold value can be set is a range in which the test pattern 61 can be elastically deformed. Therefore, the third threshold value is set on the basis of the mechanoluminescence intensity (hereinafter, referred to as light emission intensity Ey) at which the plastic deformation of the test pattern 61 starts. The test pattern 61 may be managed at a value (management value) that is less than the light emission intensity Ey or is equal to or less than the light emission intensity Ey in order to prevent the test pattern 61 from being broken by plastic deformation. Therefore, the third threshold value may be set, using a value (mechanoluminescence intensity) during elastic deformation before the test pattern 61 is broken. In other words, the third threshold value may be set on the basis of the management value of the test pattern 61.

The deformation characteristics (the relationship between displacement and stress) of the template T2 vary depending on, for example, the thickness of the template T2. Therefore, the deformation characteristics of the test pattern 61 vary depending on the type of test pattern 61. For this reason, the management value of the test pattern 61 is set for each test pattern 61. Therefore, the third threshold value is set for each test pattern 61. The third threshold value is set on the basis of the deformation characteristics or the emission characteristics (the relationship between displacement and mechanoluminescence intensity) of the test pattern 61 which have been measured in advance by, for example, an experiment. As such, in this embodiment, the third threshold value is set on the basis of, for example, the structure (intensity) of the test pattern 61.

When the third threshold value is greater than the mechanoluminescence intensity (Step S230, No), the determination unit 23 determines that the template T2 is reused (is not abnormal) (Step S240). As such, when the mechanoluminescence intensity of the test pattern 61 is less than, the third threshold value, it is determined that the template T2 does not need to be replaced (is not abnormal) since the deterioration of the template T2 is not in progress.

The determination unit 23 generates third determination result information indicating that the template T2 is determined to be reused (not to be abnormal) and transmits the third determination result information to the instruction generator 24. The instruction generator 24 generates a display instruction to display the third determination result information and transmits the display instruction to, for example, a display device (not illustrated).

It is determined in Step S230 that the third threshold value is equal to or less than the mechanoluminescence intensity (Step S230, Yes), the determination unit 23 determines that a process of discarding the template T2 is performed (is abnormal) (Step S250). As such, when the mechanoluminescence intensity of the test pattern 61 is equal to or greater than the third threshold value, it is determined that the template T2 needs to be replaced (is abnormal) since the deterioration of the template T2 is in progress. When the mechanoluminescence intensity of the test pattern 61 is equal to the third threshold value, the determination unit 23 may determine that the template T2 is reused (is not abnormal).

When it is determined that the template T2 is reused (is not abnormal) or when it is determined that the template T2 is discarded (is abnormal), the imprint apparatus 101 controls the posture of the template T2 according to stress and emits light to the resist 3, similarly to the first embodiment. Then, the resist 3 is hardened and a resist pattern 30 is formed. Then, the imprint apparatus 101 performs a demolding process of separating the template 72 from the resist pattern 30.

The imprint apparatus 101 may determine any one of the process of determining the replacement time (abnormality) of the template T2 and the process of controlling the posture of the template T2 first. In addition, the imprint apparatus 101 may determine the replacement time (abnormality) of the template T2 and may omit the process of controlling the posture of the template T2. In the template T2, the mechanoluminescent material may be contained only in a region in which the test pattern 61 is formed.

In this embodiment, the controller 20 may not include the stress distribution calculator 22. In this case, the mechanoluminescence intensity from the light receiver 11 is directly transmitted from the input unit 21 to the determination unit 23. When the controller 20 includes the stress distribution calculator 22, the mechanoluminescence intensity from the light receiver 11 is transmitted from the input unit 21 to the determination unit 23 through the stress distribution calculator 22.

As such, according to the third embodiment, the template T2 includes the test pattern 61 and the lifespan (abnormality) of the template T2 is determined on the basis of the stress distribution of the test pattern 61. Therefore, it is possible to accurately determine the lifespan (abnormality) of the template T2. In addition, even if the template T2 is repeatedly used, it is possible to determine the lifespan (abnormality) of the template T2 before a defect occurs in the template pattern.

Fourth Embodiment

Next, a fourth embodiment will be described with reference to FIGS. 11A to 13. In the fourth embodiment, a portion of a resist 3 in a template pattern is hardened by mechanoluminescence from a template Tx.

FIGS. 11A to 11E are diagrams illustrating an imprint process according to the fourth embodiment. FIGS. 11A to 11E are cross-sectional views illustrating, for example, a wafer WA and a template T3, which is an example of the template Tx, in the imprint process. In the process described in FIGS. 11A to 11E, the description of the same steps as those in FIGS. 2A to 2E will not be repeated.

Figure 11A:
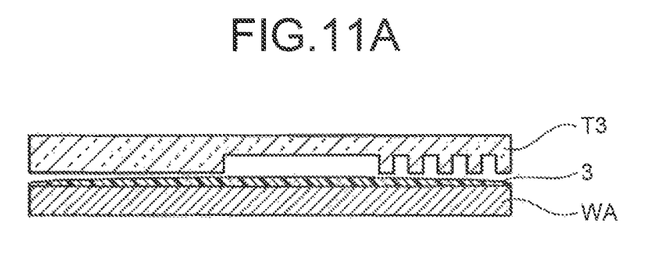
FIGS. 11A to 11E are diagrams illustrating an imprint process according to a fourth embodiment.
Figure 11B:
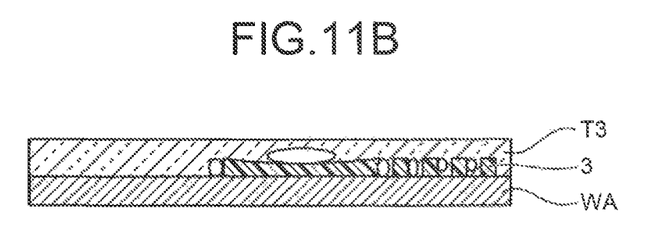

The resist 3 is dropped to the upper surface of the wafer WA. Then, as illustrated in FIG. 11A, the template T3 is moved to the resist 3. As illustrated in FIG. 11B, the template T3 is pressed against the resist 3. Then, the resist 3 flows into the template pattern.

The template T3 includes a mechanoluminescent material and transmits light. In this embodiment, the mechanoluminescent material included in the template T3 emits light which can harden the resist 3.

Figure 11C:
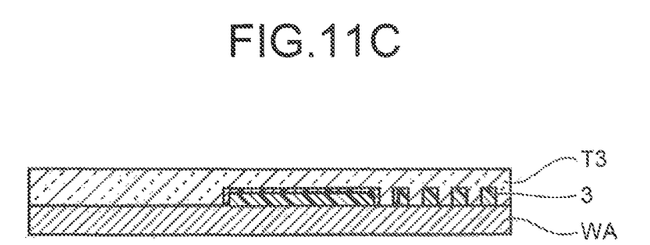

The imprint apparatus 101 fills the template T3 with the resist 3 for a predetermined period of time. In this case, when stress is applied to the template T3, the mechanoluminescent material included in the template T3 emits light. In the template T3, a portion of the resist 3 is hardened in the vicinity of a portion in which mechanoluminescence occurs, as illustrated in FIG. 11C. The mechanoluminescence occurs in a portion of the template T3 to which load is likely to be applied. Therefore, the resist 3 in a portion of the template T3 to which load is likely to be applied is hardened.

Figure 11D:
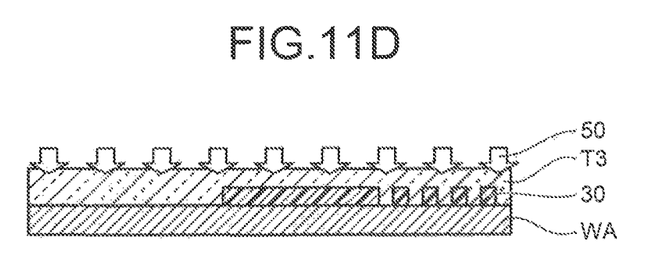
Figure 11E:
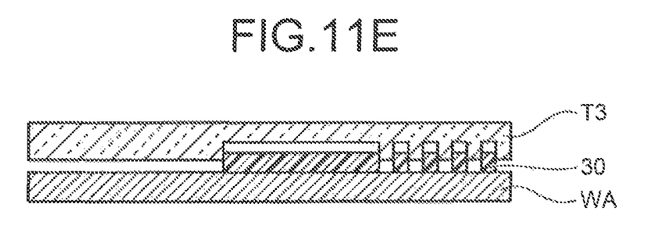

Then, as illustrated in FIG. 11D, light 50 is emitted to the rear surface of the template T3. Then, the light 50 passes through the template T3 and is incident on the resist 3. The entire resist 3 is hardened. Then, as illustrated in FIG. 11E, the template T3 is separated from a hardened resist pattern 20. In this way, the resist pattern 30 which is a reverse pattern of the template pattern is formed on the wafer WA.

Figure 12:
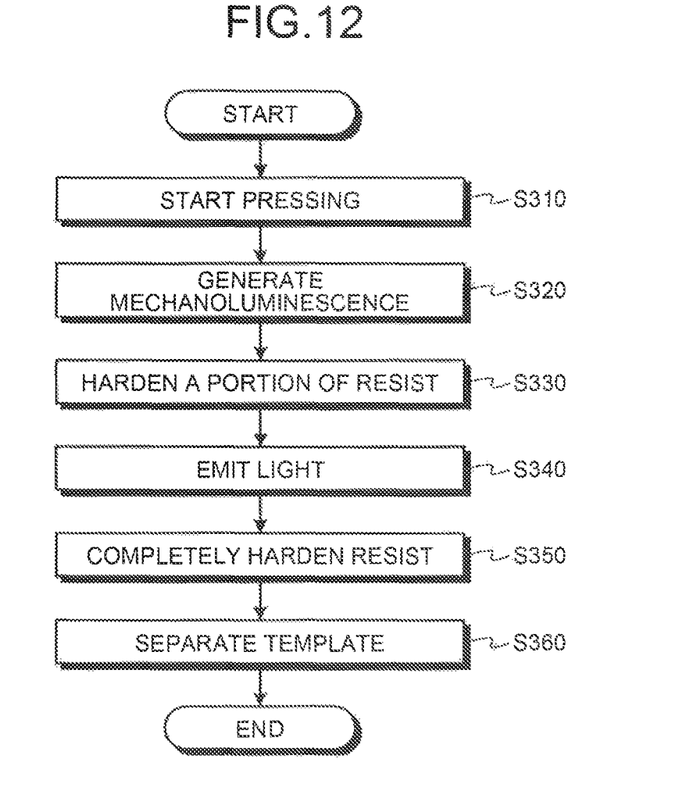
FIG. 12 is a flowchart illustrating the procedure of the imprint process according to the fourth embodiment.

FIG. 12 is a flowchart illustrating the procedure of the imprint process according to the fourth embodiment. When the imprint apparatus 101 starts to press the template T3 against the resist 3 (Step S310), mechanoluminescence from the template T3 occurs (Step S320). A portion of the resist 3 is hardened by the mechanoluminescence (Step S330).

In the template T3, the template pattern is filled with the resist 3 and a portion of the resist 3 is hardened. Then, when a certain period of time has elapsed, the filling of the template pattern with the resist 3 and the hardening of a portion of the resist 3 are completed.

Then, the light source 10 emits light to the resist 3 from the upper side of the template T3 (Step S340). Then, the resist 3 is completely hardened (at a certain hardness level) and the resist pattern 30 is formed (Step S350). Then, the imprint apparatus 101 performs a demolding process which separates the template T3 from the resist pattern 30 (Step S360). Similarly to the first embodiment, the imprint apparatus 101 may control the posture of the template T3 according to stress and then emit light to the resist 3.

For example, the imprint process of the imprint apparatus 101 is performed for each layer of a wafer process. For example, after a film to be processed is formed on the wafer WA, the resist 3 is dropped to the film to be processed. The imprint apparatus 101 performs the imprint process for the wafer WA having the resist 3 applied thereon, using the template Tx, to forms the resist pattern 30 on the wafer WA. Then, the film to be processed which is provided below the resist pattern is etched, using the resist pattern 30 as a mask. In this way, the actual pattern corresponding to the resist pattern 30 is formed on the wafer WA. When a semiconductor device (semiconductor integrated circuit) is manufactured, the process of forming the film to be processed, for example, the imprint process according to the first to fourth embodiments, and the etching process are repeatedly performed for each layer.

Figure 13:
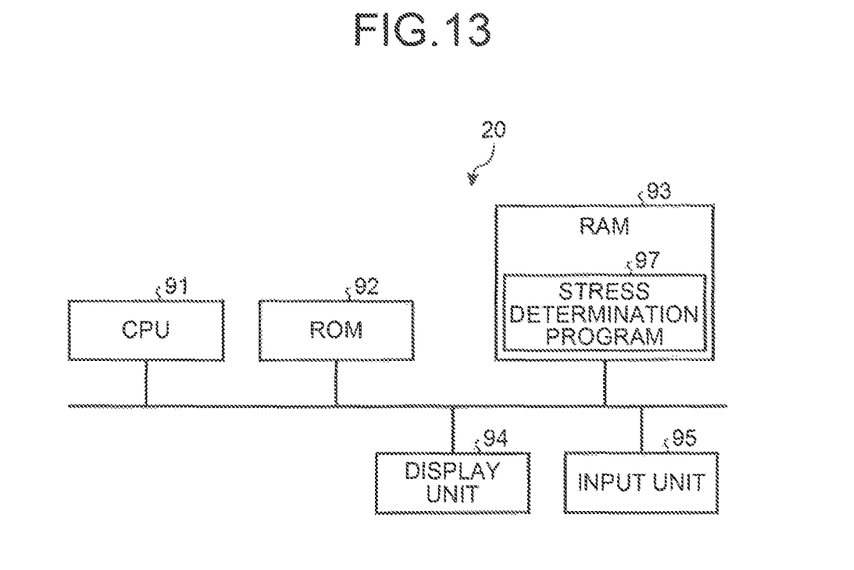
FIG. 13 is a diagram illustrating the hardware configuration of a controller.

Next, the hardware configuration of the controller 20 will be described. FIG. 13 is a diagram illustrating the hardware configuration of the controller. The controller 20 includes a central processing unit (CPU) 91, a read only memory (ROM) 92, a random access memory (RAM) 93, a display unit 94, and an input unit 95. In the controller 20, the CPU 91, the ROM 92, the RAM 93, the display unit 94, and the input unit 95 are connected to each other through a bus line.

The CPU 91 determines stress applied to the template Tx and the lifespan (abnormality) of the template Tx, using a stress determination program 97 which is a computer program. The stress determination program 97 is a computer program product having a nontransitory computer readable recording medium which includes a plurality of commands for calculating a liquid drop position and can be executed by a computer. In the stress determination program 97, the plurality of commands cause the computer to determine stress or a lifespan (abnormality).

The display unit 94 is a display device, such as a liquid crystal monitor, and displays, for example, a template pattern, mechanoluminescence intensity, a stress distribution, and the first to third determination result information items in response to an instruction from the CPU 91. The input unit 95 includes a mouse or a keyboard and receives instruction information (for example, parameters required to determine stress or a lifespan (abnormality)) which is input by the user. The instruction information input to the input unit 95 is transmitted to the CPU 91.

The stress determination program 97 is stored in the ROM 92 and is loaded to the RAM 93 through the bus line. FIG. 13 illustrates a state in which the stress determination program 97 is loaded to the RAM 93.

The CPU 91 executes the stress determination program 97 loaded to the RAM 93. Specifically, in the controller 20, when the user uses the input unit 95 to input an instruction, the CPU 91 reads the stress determination program 97 from the ROM 92, develops the stress determination program 97 in a program storage area of the RAM 93, and performs various processes. The CPU 91 temporarily stores various kinds of data which are generated during various processes in a data storage area of the RAM 93.

The stress determination program 97 executed by the controller 20 has a module structure including the stress distribution calculator 22, the determination unit 23, and the instruction generator 24. These units are loaded to the main memory device and are generated in the main memory device.

As such, according to the fourth embodiment, the imprint apparatus 101 hardens the resist 3, which is located in the vicinity of a portion of the template T3 to which load is likely to be applied, in advance. Specifically, the imprint apparatus 101 hardens a portion of the resist 3 in the template pattern in advance, using mechanoluminescence from the template T3. Therefore, a portion of the template pattern on which load is likely to be concentrated is supported by the hardened resist 3. As a result, it is possible to reduce the concentration of stress on the template T3 when the template T3 is pressed against the resist 3. Therefore, it is possible to reduce load when the template T3 is imprinted.

The controller 20 may change the first to third threshold values depending on process conditions. The process conditions include, for example, the type of resist 3, the elastic modulus (ease of warping) of the template Tx, deformation characteristics, the depth of a template pattern (difference in height between a recess portion and a protrusion portion), and the minimum width. In addition, the controller 20 may change the first to third threshold values for each position of the template pattern. In this case, the controller 20 uses different threshold values corresponding to the density of a pattern or the dimensions of a patter at each position of the template pattern.

The first to fourth embodiments may be combined with each other. For example, when the second embodiment and the fourth embodiment are combined with each other, a portion of the resist 3 is hardened by mechanoluminescence from the template Tx in advance and the lifespan (abnormality) of the template Tx is determined on the basis of the stress distribution of the template Tx. When the third embodiment and the fourth embodiment are combined with each other, a portion of the resist 3 is hardened by mechanoluminescence from the template Tx in advance and the lifespan (abnormality) of the template Tx is determined using the test pattern 61. When the first embodiment and the third embodiment are combined with each other, the posture of the template Tx is adjusted on the basis of mechanoluminescence intensity and the lifespan (abnormality) of the template Tx is determined using the test pattern 61.

(Appendix 1)

There is provided an imprint method including: a contact step of bringing a template including a mechanoluminescent material into contact with a resist on a substrate; a first hardening step of hardening a portion of the resist in a template pattern of the template, using mechanoluminescence from the template; a second hardening step of emitting light to the resist to completely harden the resist; and a demolding step of separating the template from the resist.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus comprising:
   a light receiver that measures the intensity of mechanoluminescence from a template including a mechanoluminescent material when the template comes into contact with a resist on a substrate, the mechanoluminescent material being a mixture of zinc sulfide and manganese or a mixture of strontium aluminate and europium;
   a controller that generates an instruction to adjust the posture of the template on the basis of the intensity of the mechanoluminescence; and
   a posture control mechanism that adjusts the posture of the template on the basis of the instruction.

2. The imprint apparatus according to claim 1,
   wherein the controller determines whether the template is abnormal on the basis of the intensity of the mechanoluminescence.

3. The imprint apparatus according to claim 2,
   wherein the controller compares the intensity of the mechanoluminescence with a first threshold value and determines whether the template is abnormal on the basis of the comparison result, and
   the first threshold value is set according to imprint process conditions.

4. The imprint apparatus according to claim 2,
   wherein the controller determines whether the template is abnormal on the basis of a difference between a distribution of the intensity of mechanoluminescence that is currently measured and a distribution of the intensity of mechanoluminescence that has been measured first.

5. The imprint apparatus according to claim 3,
   wherein the controller compares the difference with a second threshold value and determines whether the template is abnormal on the basis of the comparison result, and
   the second threshold value is set according to the imprint process conditions.

6. The imprint apparatus according to claim 1, wherein the posture control mechanism is arranged on the rear surface of the template.

7. The imprint apparatus according to claim 1, wherein the posture control mechanism is separated from the template when the template is detached.

8. The imprint apparatus according to claim 1, wherein the posture control mechanism adjusts a posture of the template by an amount corresponding to the mechanoluminescence intensity.

9. The imprint apparatus according to claim 1, wherein the light receiver is provided above a stage base.

10. The imprint apparatus according to claim 1, wherein the light receiver measures mechanoluminescence intensity from a test pattern.

11. An imprint method comprising:
    bringing a template including a mechanoluminescent material into contact with a resist on a substrate, the mechanoluminescent material being a mixture of zinc sulfide and manganese or a mixture of strontium aluminate and europium;
    adjusting the posture of the template on the basis of the intensity of mechanoluminescence from the template;
    emitting light to the resist to harden the resist; and
    separating the template from the resist.

12. The imprint method according to claim 11, further comprising:
    determining whether the template is abnormal on the basis of the intensity of the mechanoluminescence.

13. The imprint method according to claim 12,
    wherein the intensity of the mechanoluminescence is compared with a first threshold value,
    it is determined whether the template is abnormal on the basis of the comparison result, and the first threshold value is set according to imprint process conditions.

14. The imprint method according to claim 12, wherein it is determined whether the template is abnormal on the basis of a difference between a distribution of the intensity of mechanoluminescence that is currently measured and a distribution of the intensity of mechanoluminescence that has been measured first.

15. The imprint method according to claim 14, wherein the difference is compared with a second threshold value, it is determined whether the template is abnormal on the basis of the comparison result, and the second threshold value is set according to the imprint process conditions.

16. The imprint method according to claim 11, wherein mechanoluminescence from the mechanoluminescent material is visible light, infrared rays, or ultraviolet rays.

17. The imprint method according to claim 12, wherein the template includes a first pattern and a second pattern having a lower strength than the first pattern, and it is determined whether the template is abnormal on the basis of the intensity of mechanoluminescence from the second pattern.

18. The imprint method according to claim 12, wherein the mechanoluminescent material comprises the mixture of zinc sulfide and manganese.

19. The imprint method according to claim 12, wherein the mechanoluminescent material comprises the mixture of strontium aluminate and europium.

* * * * *